(12) United States Patent
Kim

(10) Patent No.: US 12,376,301 B2
(45) Date of Patent: Jul. 29, 2025

(54) SEMICONDUCTOR MEMORY DEVICE AND MANUFACTURING METHOD OF THE SEMICONDUCTOR MEMORY DEVICE

(71) Applicant: SK hynix Inc., Icheon-si Gyeonggi-do (KR)

(72) Inventor: Nam Kuk Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 475 days.

(21) Appl. No.: 17/746,312

(22) Filed: May 17, 2022

(65) Prior Publication Data

US 2023/0171959 A1 Jun. 1, 2023

(30) Foreign Application Priority Data

Nov. 26, 2021 (KR) .......................... 10-2021-0165586

(51) Int. Cl.
| | | |
|---|---|---|
| *H10B 43/27* | (2023.01) | |
| *H01L 21/78* | (2006.01) | |
| *H01L 23/00* | (2006.01) | |
| *H01L 25/00* | (2006.01) | |

(Continued)

(52) U.S. Cl.
CPC ......... *H10B 43/27* (2023.02); *H01L 21/7806* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01);

(Continued)

(58) Field of Classification Search
CPC ........ H10B 41/00–70; H10B 43/00–50; G11C 16/0408–0458; G11C 16/0483; G11C 11/5621–5642; G11C 2216/06–10; G11C 16/0466–0475; G11C 27/005; G11C 11/5671

See application file for complete search history.

(56) References Cited

U.S. PATENT DOCUMENTS 9,824,966 B1 11/2017 Kanakamedala et al.
2014/0291751 A1* 10/2014 Lee ..................... H01L 21/0223
257/324

(Continued)

FOREIGN PATENT DOCUMENTS

| CN | 107046037 A | 8/2017 |
|---|---|---|
| CN | 108022928 A | 5/2018 |

(Continued)

*Primary Examiner* — Christine S. Kim
*Assistant Examiner* — Cole Leon Lindsey
(74) *Attorney, Agent, or Firm* — WILLIAM PARK & ASSOCIATES LTD.

(57) ABSTRACT

A semiconductor memory device includes a gate stack structure including alternately stacked interlayer insulating layers and conductive layers, a core pillar penetrating the gate stack structure, a channel layer disposed between the core pillar and the gate stack structure, a memory layer disposed between the channel layer and the gate stack structure, and a doped semiconductor part in contact with the gate stack structure. The doped semiconductor part includes a first region surrounding the core pillar up to an interface in contact with the gate stack structure and a second region extending between the memory layer and the core pillar from the first region.

15 Claims, 19 Drawing Sheets

(51) Int. Cl.
*H01L 25/065* (2023.01)
*H01L 25/18* (2023.01)

(52) U.S. Cl.
CPC ............. *H01L 2924/1431* (2013.01); *H01L 2924/14511* (2013.01)

(56) References Cited

U.S. PATENT DOCUMENTS

| | | | |
|---|---|---|---|
| 2015/0243672 A1* | 8/2015 | Kim | H10D 64/037 257/324 |
| 2015/0364381 A1* | 12/2015 | Choi | H01L 29/42356 438/268 |
| 2017/0025421 A1 | 1/2017 | Sakakibara et al. | |
| 2017/0154892 A1 | 6/2017 | Oh | |
| 2017/0213843 A1 | 7/2017 | Choi | |
| 2018/0175053 A1 | 6/2018 | Park et al. | |
| 2018/0366486 A1 | 12/2018 | Hada et al. | |
| 2019/0157291 A1 | 5/2019 | Kam et al. | |
| 2020/0258817 A1 | 8/2020 | Okina et al. | |
| 2020/0395379 A1 | 12/2020 | Lee et al. | |
| 2021/0028188 A1 | 1/2021 | Kim et al. | |
| 2022/0037267 A1* | 2/2022 | Zhang | H01L 24/08 |

FOREIGN PATENT DOCUMENTS

| | | |
|---|---|---|
| CN | 108140643 A | 6/2018 |
| CN | 109148457 A | 1/2019 |
| CN | 109273447 A | 1/2019 |
| CN | 109671711 A | 4/2019 |
| CN | 112951841 A | 6/2021 |
| JP | 2019165135 | 9/2019 |
| KR | 1020190107975 A | 9/2019 |
| KR | 1020200141807 A | 12/2020 |
| KR | 1020210012827 A | 2/2021 |
| WO | 2015038246 A2 | 3/2015 |

* cited by examiner

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2021-0165586 filed on Nov. 26, 2021, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device may include a memory cell array having a plurality of memory cells. The memory cell array may include memory cells arranged in various ways. In order to improve the degree of integration of a semiconductor memory device, memory cells may be three-dimensionally arranged above a substrate. A stack structure in which a plurality of material layers are stacked may be used when a three-dimensional semiconductor memory device is manufactured.

SUMMARY

Some embodiments provide a semiconductor memory device and a method of manufacturing the semiconductor memory device, which can simplify a manufacturing process.

In accordance with an embodiment of the present disclosure, a semiconductor memory device includes: a gate stack structure including interlayer insulating layers and conductive layers, which are alternately stacked; a core pillar penetrating the gate stack structure; a channel layer disposed between the core pillar and the gate stack structure; a memory layer disposed between the channel layer and the gate stack structure; and a doped semiconductor part in contact with the gate stack structure. The doped semiconductor part includes: a first region surrounding the core pillar up to an interface in contact with the gate stack structure; and a second region extending between the memory layer and the core pillar from the first region.

In accordance with another embodiment of the present disclosure, a semiconductor memory device includes: a substrate including a peripheral circuit; a memory cell array including a gate stack structure disposed above the peripheral circuit, a core pillar penetrating the gate stack structure, a channel layer disposed between the core pillar and the gate stack structure, and a memory layer disposed between the channel layer and the gate stack structure; and a doped semiconductor part including a first region surrounding the core pillar up to an interface in contact with the gate stack structure and a second region extending between the core pillar and the memory layer from the first region.

In accordance with still another aspect of the present disclosure, a method of manufacturing a semiconductor memory device includes: forming a memory cell array on a first substrate, wherein the memory cell array includes a gate stack structure including interlayer insulating layers and conductive layers, which are alternately stacked in a vertical direction, a channel hole which penetrates the gate stack structure and extends into the first substrate, a memory layer extending along a surface of the channel hole, a channel layer extending along a surface of the memory layer, and a core pillar disposed in a central region of the channel hole on the channel layer; removing the first substrate such that the memory layer is exposed; removing a portion of the memory layer such that a portion of the channel layer is exposed; etching a portion of the channel layer such that a recess region is defined between the core pillar and the memory layer; and forming a doped semiconductor part filling the recess region.

BRIEF DESCRIPTION OF THE DRAWINGS

Example embodiments will now be described more fully hereinafter with reference to the accompanying drawings; however, they may be embodied in different forms and should not be construed as being limited as set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it might be the only element between the two elements, or one or more intervening elements may also be present. Like reference numerals refer to like elements throughout the disclosure.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and should not be construed as being limited to the embodiments set forth herein.

It will be understood that, although the terms "first," "second," etc. may be used herein to describe various elements, these elements should not be limited by these terms. These terms are only used to distinguish one element from another element. Thus, a "first" element described below could also be termed a "second" element without departing from the teachings of the present disclosure.

Figure 1:
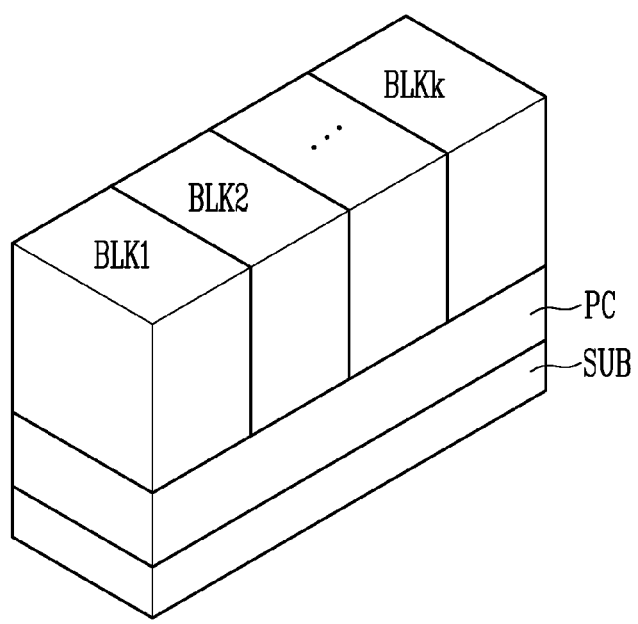
FIG. 1 is a block diagram illustrating a semiconductor memory device in accordance with an embodiment of the present disclosure.

FIG. 1 is a block diagram schematically illustrating a semiconductor memory device in accordance with an embodiment of the present disclosure.

Referring to FIG. 1, the semiconductor memory device may include a peripheral circuit structure PC and memory blocks BLK1 to BLKk (k is a natural number equal to or greater than 2), which are disposed on a substrate SUB. The memory blocks BLK1 to BLKk may overlap the peripheral circuit structure PC.

The substrate SUB may be a single crystalline semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed through a selective epitaxial growth process.

The peripheral circuit structure PC may include a row decoder, a column decoder, a page buffer, a control circuit, and the like, which constitute a circuit for controlling an operation of the memory blocks BLK1 to BLKk. For example, the peripheral circuit structure PC may include an NMOS transistor, a PMOS transistor, a resistor, and a capacitor, which are electrically connected to the memory blocks BLK1 to BLKk. The peripheral circuit structure PC may be disposed between the substrate SUB and the memory blocks BLK1 to BLKk. However, the present disclosure does not exclude an embodiment in which the peripheral circuit structure PC extends to another region of the substrate SUB, which does not overlap with the memory blocks BLK1 to BLKk.

Each of the memory blocks BLK1 to BLKk may include impurity doping regions, bit lines, cell strings electrically connected to the impurity doping regions and the bit lines, word lines electrically connected to the cell strings, and select lines electrically connected to the cell strings. Each of the cell strings may include memory cells and select transistors, which are connected in series by a channel structure. Each of the select lines is used as a gate electrode of a select transistor corresponding thereto, and each of the word lines is used as a gate electrode of a memory cell corresponding thereto.

Figure 2:
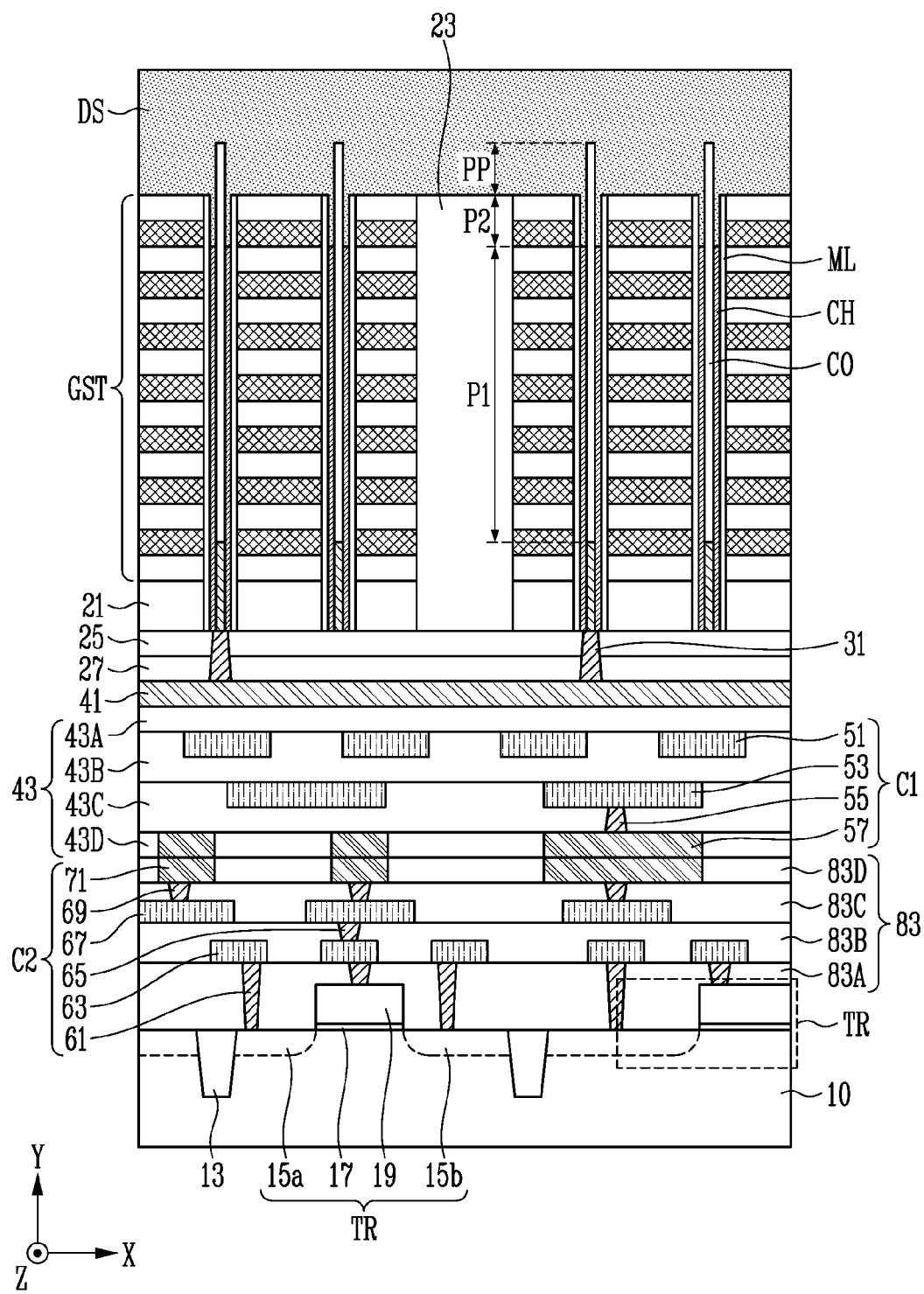
FIG. 2 is a sectional view illustrating a semiconductor memory device in accordance with an embodiment of the present disclosure.

FIG. 2 is a sectional view illustrating a semiconductor memory device in accordance with an embodiment of the present disclosure.

Referring to FIG. 2, the semiconductor memory device may include a doped semiconductor part DS, gate stack structures GST, channel structures CH, a memory layer ML, a line array 41, first connection structures C1, a first insulating structure 43, second connection structures C2, and transistors TR of a peripheral circuit.

A substrate 10 may constitute the substrate SUB shown in FIG. 1. The transistors TR may constitute a portion of the peripheral circuit structure PC shown in FIG. 1. The transistors TR may be formed in an active region of the substrate 10. The active region of the substrate 10 may be partitioned by isolation layers 13 in the substrate 10. Each of the transistors TR may include a gate insulating layer 17, a gate electrode 19, and junctions 15a and 15b formed in the active region at both sides of the gate electrode 19.

The second connection structures C2 and a second insulating structure 83 may be disposed on the substrate 10. Each of the second connection structures C2 may include a plurality of conductive layers 61, 63, 65, 67, 69, and 71. The second insulating structure 83 may cover the transistors TR. The second connection structures C2 may be disposed inside the second insulating structure 83. The second insulating structure 83 may include two or more insulating layers, with four being shown 83A, 83B, 83C, and 83D.

The first connection structures C1 and the first insulating structure 43 may be disposed on the second insulating structure 83. Each of the first connection structures C1 may include a plurality of conductive layers 51, 53, 55, and 57. The first insulating structure 43 may cover the second insulating structure 83. The first connection structures C1 may be disposed inside the first insulating structure 43. The first insulating structure 43 may include two or more insulating layers, with four being shown 43A, 43B, 43C, and 43D.

The plurality of conductive layers 51, 53, 55, and 57 constituting the first connection structures C1 may include a first bonding metal 57. The plurality of conductive layers 61, 63, 65, 67, 69, and 71 constituting the second connection structures C2 may include a second bonding metal 71. The first bonding metal 57 and the second bonding metal 71 may be bonded to each other.

The line array 41 may overlap the first insulating structure 43. The gate stack structure GST may overlap the line array 41 with at least one insulating layer interposed therebetween. In an embodiment, a first insulating layer 21, a second insulating layer 25, and a third insulating layer 27 may be disposed between the gate stack structure GST and the line array 41. The first insulating layer 21 may be disposed adjacent to the gate stack structure GST, the third insulating layer 27 may be disposed adjacent to the line array 41, and the second insulating layer 25 may be disposed between the first insulating layer 21 and the third insulating layer 27. The channel structures CH may penetrate the gate stack structure GST and the first insulating layer 21. Each of the channel structures CH may include a sidewall surrounded by a memory layer ML corresponding thereto.

Contact plugs 31 for connecting the channel structures CH and the line array 41 may penetrate the second insulating layer 25 and the third insulating layer 27. Numbers and shapes of the insulating layers 21, 25, and 27 and the contact plugs 31 between the line array 41 and the gate stack structure GST are not limited to those shown in the drawing, and may be variously changed.

A vertical direction Y may be defined in a direction in which interlayer insulating layers and conductive layers are stacked. The gate stack structures GST may extend in a first direction X and a second direction Z on a plane intersecting the vertical direction Y. A line extending in the first direction X and a line extending in the second direction Z may intersect each other. In an embodiment, the line extending in the first direction X and the line extending in the second direction Z may be orthogonal to each other.

Figure 3:
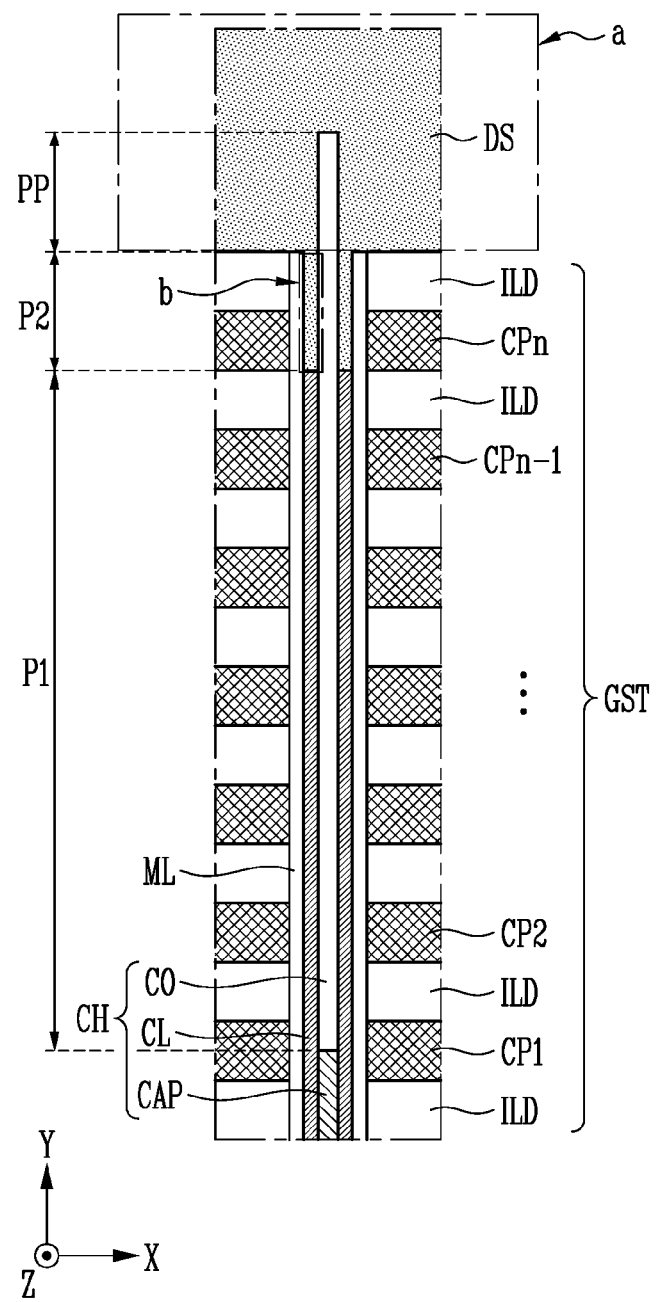
FIG. 3 is an enlarged sectional view of a partial region of the semiconductor memory device shown in FIG. 2.

Each of the channel structures CH may include a channel layer CL, a capping pattern CAP, and core pillars CO as shown in FIG. 3. The core pillar CO may include a first part P1, a second part P2 extending in the vertical direction Y from the first part P1, and a protrusion part PP extending in the vertical direction Y from the second part P2. The first part P1 may be surrounded by the gate stack structure GST with the channel layer CL and the memory layer ML interposed therebetween. The second part P2 may be surrounded by the gate stack structure GST with the memory layer ML interposed therebetween, without interposition of the channel layer CL. The protrusion part PP may protrude farther in the vertical direction Y than the gate stack structure GST. The doped semiconductor part DS may surround the protrusion part PP and the second part P2 of the core pillar CO. A portion of the doped semiconductor part DS, which surrounds the second part P2 of the core pillar CO, may extend between the memory layer ML and the second part P2 of the core pillar CO.

A vertical insulator 23 may be disposed between the gate stack structures GST.

Each of the memory blocks BLK1 to BLKk shown in FIG. 1 may include a cell string defined by the gate stack structure GST, the channel structure CH, and the memory layer ML. The line array 41 may be used as a bit line electrically connected to the cell string, and the doped semiconductor part DS may be used as a source layer electrically connected to the cell string. Hereinafter, a cell string will be described with reference to FIG. 3.

FIG. 3 is an enlarged sectional view of a partial region of the semiconductor memory device shown in FIG. 2. FIG. 3 illustrates a cell string in accordance with an embodiment of the present disclosure.

Each gate stack structure GST may include a plurality of interlayer insulating layers ILD and a plurality of conductive layers CP1 to CPn (n is a natural number equal to or greater than 3), which are alternately stacked in the vertical direction Y. The channel structure CH may penetrate the plurality of interlayer insulating layers ILD and the plurality of conductive layers CP1 to CPn. The channel structure CH may be formed in a shape penetrating the gate stack structure GST. At least one conductive layer among the plurality of conductive layers CP1 to CPn may be used as a source select line, at least one conductive layer among the plurality of conductive layers CP1 to CPn may be used as a drain select line, and each of conductive lines between the drain select line and the source select line may be used as a word line. In an embodiment, a conductive layer CP1 adjacent to the line array 41 shown in FIG. 2 may be used as a drain select line, a conductive layer CPn adjacent to the doped semiconductor part DS may be used as a source select line, and each of the other conductive layers CP2 to CPn−1 may be used as a word line. In another embodiment, the conductive layer CP1 adjacent to the line array 41 shown in FIG. 2 and the conductive layer CPn adjacent to the doped semiconductor part DS may be respectively used as a drain select line and a source select line, and each of the other conductive layers CP2 to CPn−1 may be used as a dummy word line or a word line. At least one of conductive layers adjacent to the drain select line and the source select line may be used as a dummy word line.

The channel structure CH may include a channel layer CL surrounded by the memory layer ML, a capping pattern CAP, and a core pillar CO forming a central region of the channel structure CH. The channel layer CL may be configured with silicon, germanium or a combination thereof, and be used as a channel region of a cell string. In an embodiment, the channel layer CL may include undoped silicon. The capping pattern CAP may be configured with silicon, germanium or a combination thereof, including a conductivity type dopant for junctions. In an embodiment, the capping pattern CAP may be configured with n-type doped silicon.

The cell string may include at least one source select transistor, a plurality of memory cells, and at least one drain select transistor, which are connected in series by the channel layer CL. The plurality of memory cells may be defined at intersection portions of a plurality of conductive layers (e.g., CP2 to CPn−1) used as a plurality of word lines and the channel structure CH.

The doped semiconductor part DS may include a first region a and a second region b. The first region a of the doped semiconductor part DS may surround the protrusion part PP of the core pillar CO up to an interface in contact with the gate stack structure GST. The first region a of the doped semiconductor part DS may extend in a direction intersecting the core pillar CO. In an embodiment, the doped semiconductor part DS may extend in the first direction X and the second direction Z along a surface of the gate stack structure GST, and extend to cover the protrusion part PP of the core pillar CO. The second region b of the doped semiconductor part DS may extend between the memory layer ML and the core pillar CO of the channel structure CH from the first region a. In an embodiment, the second region b may extend up to the conductive layer CPn adjacent to the protrusion part PP of the core pillar CO among at least the conductive layers CP1 to CPn. The second region b may provide a junction overlap region of a select transistor (e.g., the source select transistor) connected to the conductive layer CPn.

Figure 4A:
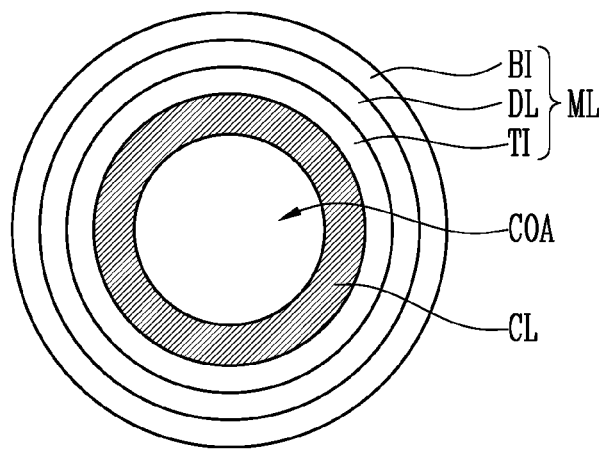
FIG. 4A is a diagram illustrating a cross-section of a core pillar, a channel layer, and a memory layer.
Figure 4B:
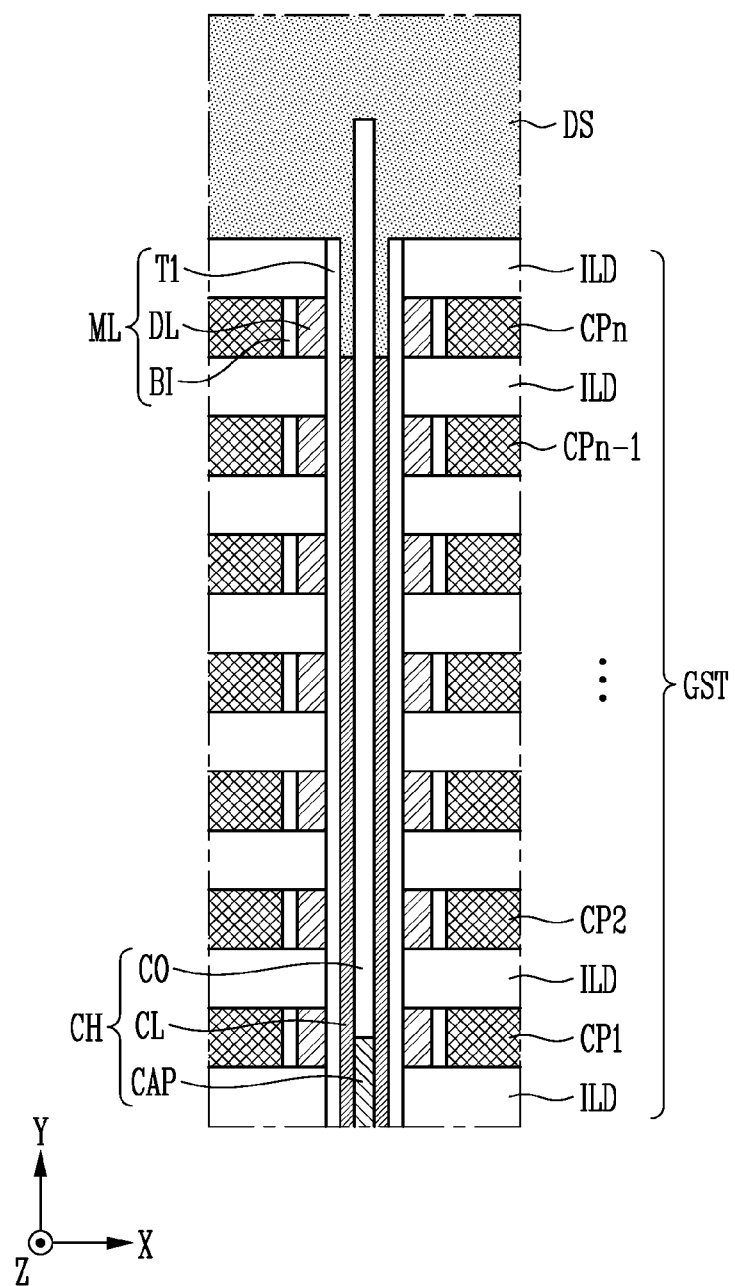
FIG. 4B is an enlarged view of a partial region of a semiconductor memory device in accordance with an embodiment of the present disclosure.

FIG. 4A is a diagram illustrating a cross-section of the core pillar, the channel layer, and the memory layer. FIG. 4B is an enlarged view of a partial region of the semiconductor memory device in accordance with an embodiment of the present disclosure.

Referring to FIG. 4A, the channel layer CL may be formed in a ring shape defining a core region COA. The core region COA may be filled with the core pillar CO shown in each of FIGS. 2 and 3.

Referring to FIG. 4B, the memory layer ML surrounding the channel layer CL may include a tunnel insulating layer TI, a data storage layer DL, and a blocking insulating layer BI, which are sequentially stacked on a surface of the channel layer CL. The data storage layer DL may be formed of a material layer capable of storing data changed using Fowler-Nordheim tunneling. To this end, the data storage layer DL may be formed of various materials. For example, the data storage layer DL may be formed of a nitride layer in which charges can be trapped. However, embodiments of the present disclosure are not limited thereto, and the data storage layer DL may include silicon, a phase change material, a nano dot, and the like. The blocking insulating layer BI may include an oxide layer capable of blocking the movement of charges. The tunnel insulating layer TI may include a silicon oxide layer through which charges can tunnel.

FIGS. 5A to 5F, 6, 7, and 8A to 8D are sectional views illustrating a manufacturing method of a semiconductor memory device in accordance with an embodiment of the present disclosure.

Figure 5A:
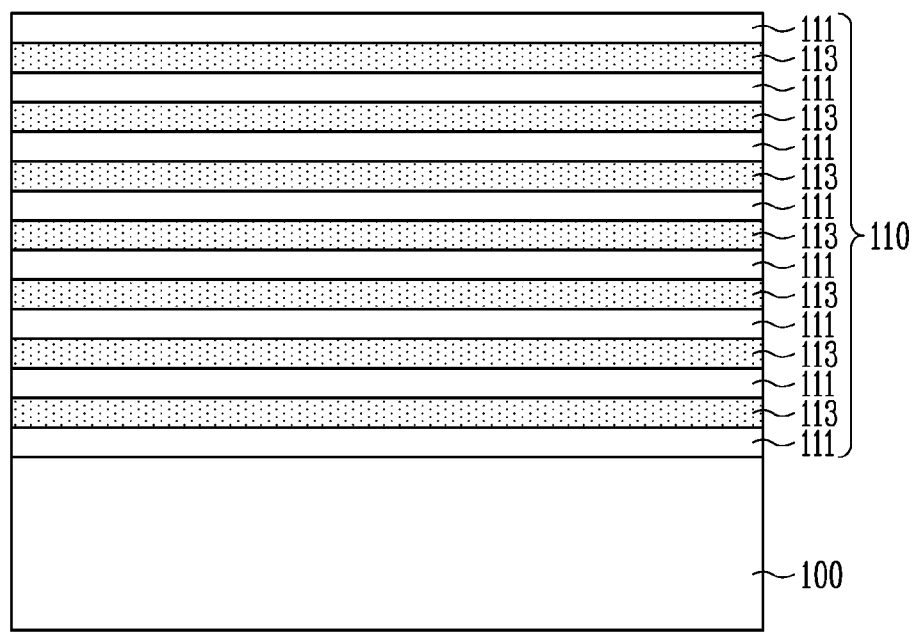
FIGS. 5A to 5F, 6, 7, and 8A to 8D are sectional views illustrating a manufacturing method of a semiconductor memory device in accordance with an embodiment of the present disclosure.

Referring to FIG. 5A, a preliminary stack structure 110 may be formed on a first substrate 100 including a cell region. The process of forming the preliminary stack structure 110 may include a process of alternately stacking interlayer insulating layers 111 and sacrificial layers 113 in a vertical direction on the first substrate 100.

The first substrate 100 may be formed of a material having an etching rate different from etching rates of the interlayer insulating layers 111 and the sacrificial layers 113. For example, the first substrate 100 may include silicon.

The interlayer insulating layers 111 and the sacrificial layers 113 may include materials having different etching selectivities with respect to an etchant used in an etching process. The sacrificial layers 113 may be formed of a material which can be rapidly removed as compared with the interlayer insulating layers 111 through the etching process. In an embodiment, the interlayer insulating layers 111 may be formed with a silicon oxide layer, and the sacrificial layers 113 may be formed with a silicon nitride layer.

Figure 5B:
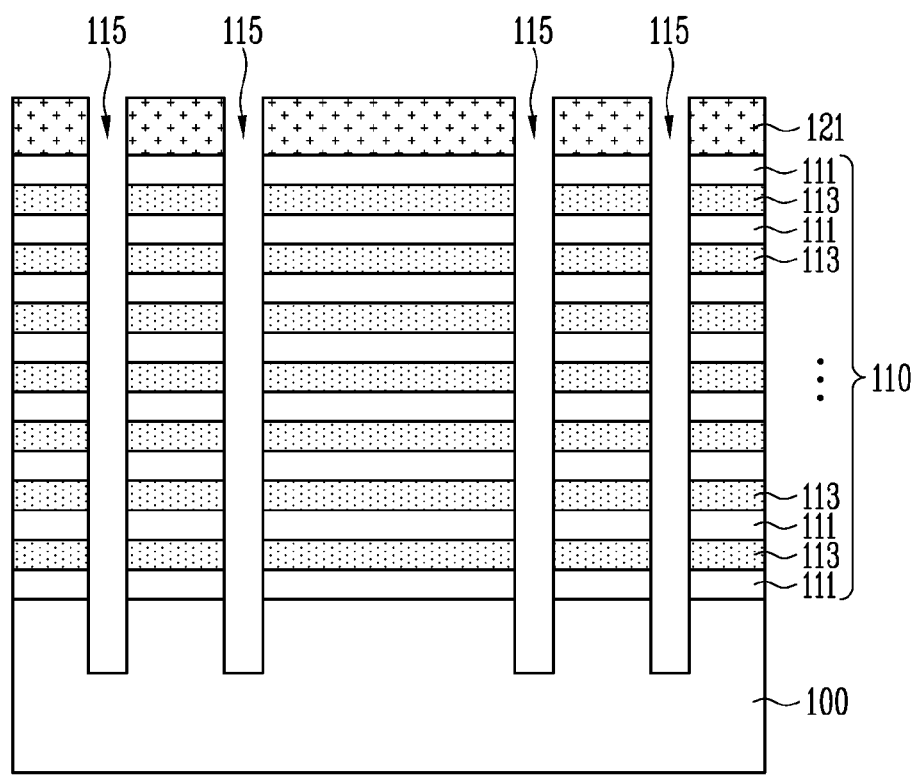

Referring to FIG. 5B, a mask pattern 121 including an opening may be formed on the preliminary stack structure 110. Subsequently, a channel hole 115 penetrating the interlayer insulating layers 111 and the sacrificial layers 113 may be formed through the opening of the mask pattern 121. The channel hole 115 may extend to the inside of the cell region of the first substrate 100.

Figure 5C:
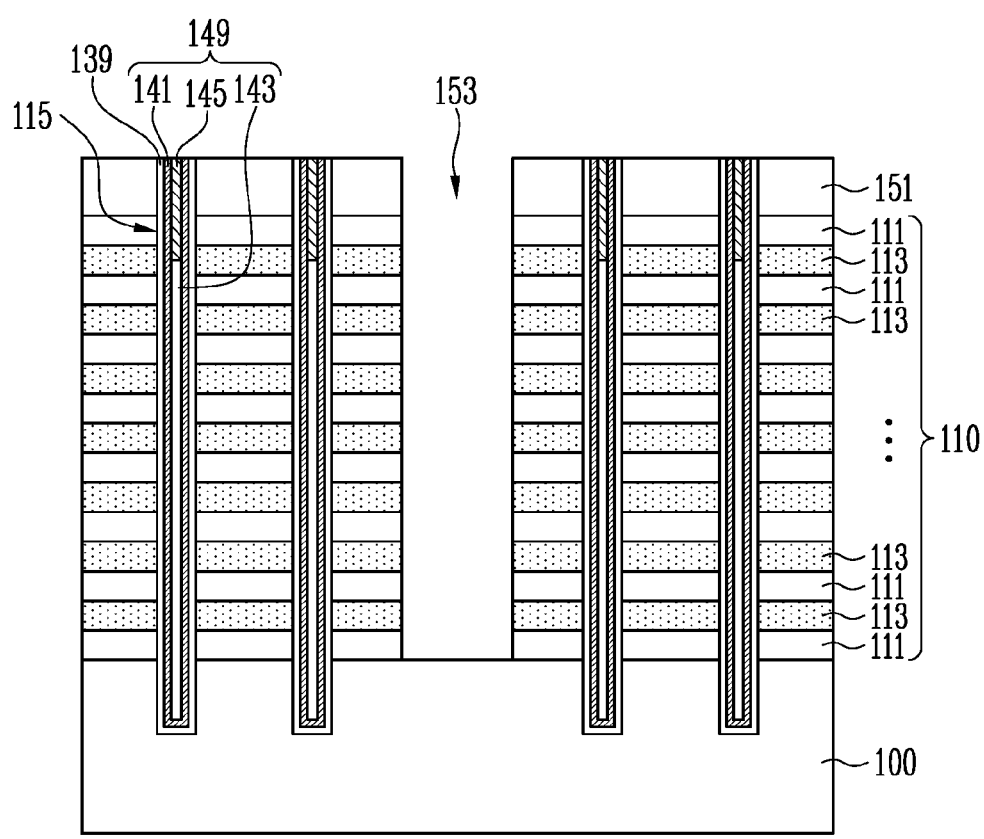

Referring to FIG. 5C, a memory layer 139 and a channel structure 149 may be formed inside the channel hole 115. An end portion of the channel structure 149, which extends to a sidewall of the channel structure 149 and the inside of the first substrate 100, may be surrounded by the memory layer 139.

The process of forming the memory layer 139 may include a process of sequentially stacking the blocking insulating layer BI, the data storage layer DL, and the tunnel insulating layer TI as described above with reference to FIG. 4A on a surface of the channel hole 115. The memory layer 139 may be formed in a liner shape, and a central region of the channel hole 115 may be defined by the memory layer 139.

The process of forming the channel structure 149 may include a process of forming a channel layer 141 on a surface of the memory layer 139. The channel layer 141 may include a semiconductor layer used as a channel region. For example, the channel layer 141 may include silicon.

In an embodiment, the channel layer 141 may be formed in a liner shape, and the central region of the channel hole 115 may include a portion which is not filled with the channel layer 141. The process of forming the channel structure 149 may include a process of filling the central region of the channel hole 115 with a core pillar 143 on the channel layer 141, a process of defining a recess region at a portion of the central region of the channel hole 115 by etching a portion of the core pillar 143, and a process of filling the recess region with a capping pattern 145. The core pillar 143 may include oxide, and the capping pattern 145 may include a conductivity type dopant. The conductivity type dopant may include an n-type dopant for junctions. The conductivity type dopant may include a counter-doped p-type dopant. The core pillar 143 may extend to the inside of the cell region of the first substrate 100.

Subsequently, a first insulating layer 151 may be formed after the mask pattern 121 shown in FIG. 5B is removed. The preliminary stack structure 110 may be penetrated by a slit 153. The slit 153 may extend to penetrate the first insulating layer 151 covering the preliminary stack structure 110.

Figure 5D:
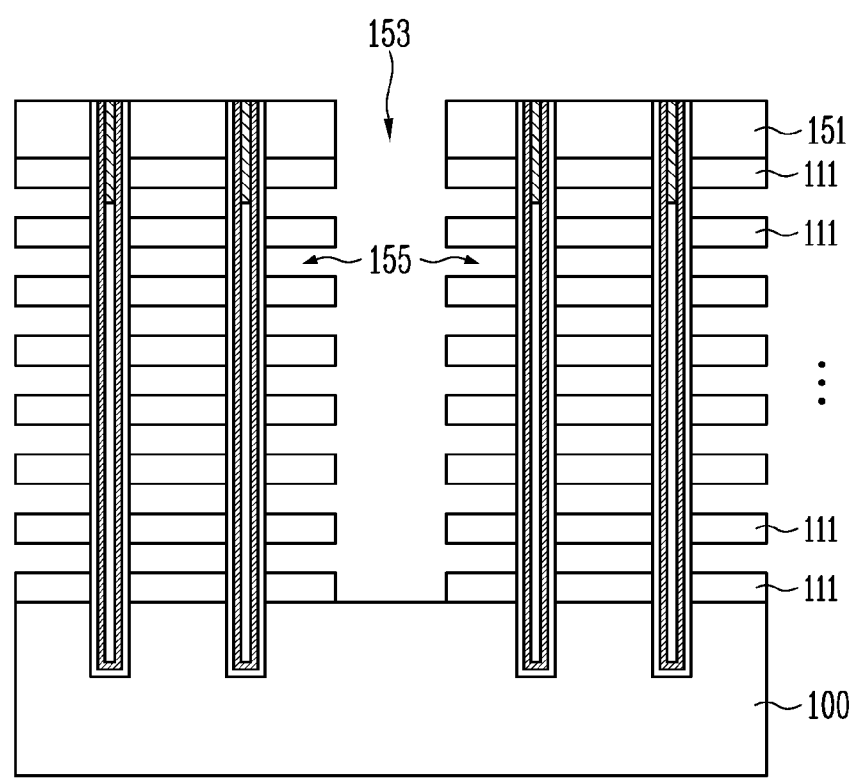

Referring to FIG. 5D, the sacrificial layers 113 shown in FIG. 5C are selectively removed through the slit 15. Therefore, horizontal spaces 155 may be defined between the interlayer insulating layers 111 adjacent to each other in the vertical direction.

Figure 5E:
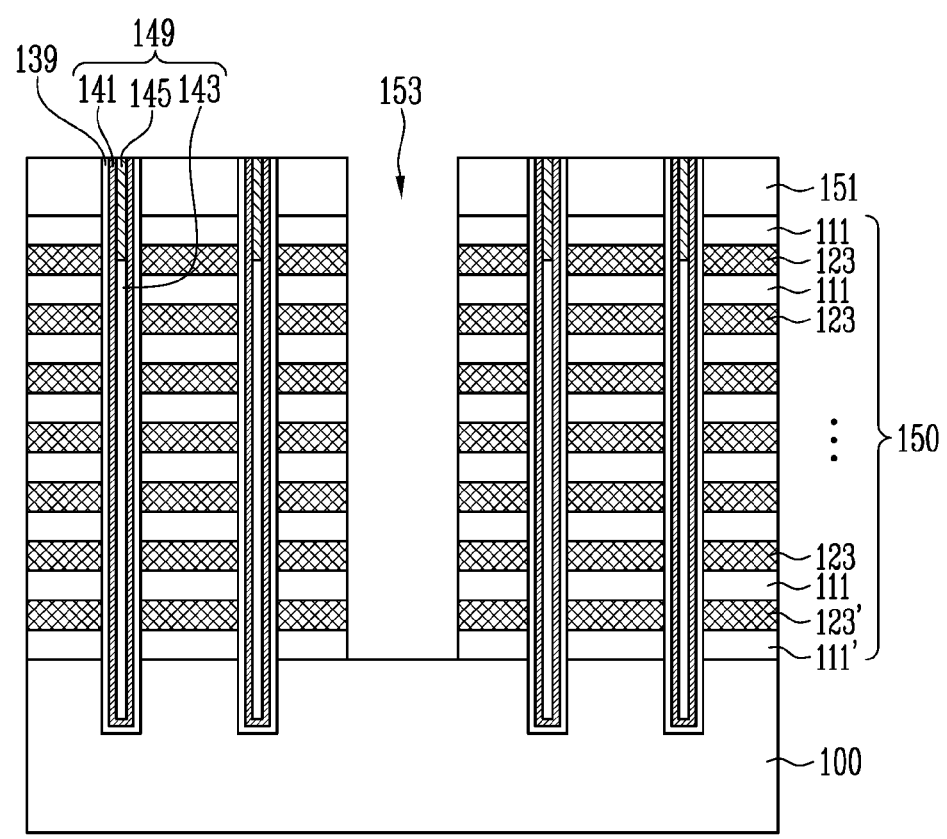

Referring to FIG. 5E, the horizontal spaces 155 shown in FIG. 5D are filled with conductive layers 123. The conductive layers 123 may surround the channel structure 149 and the memory layer 139. Accordingly, a gate stack structure 150 may be formed on the cell region of the first substrate 100. The gate stack structure 150 may be penetrated by the channel structure 149, and the channel structure 149 may extend to the inside of the cell region of the first substrate 100. The memory layer 139 may extend between the end portion of the channel structure 149 and the first substrate 100 from between the channel structure 149 and the gate stack structure 150. The core pillar 143 of the channel structure 149 may extend to the inside of the cell region of the first substrate 100.

A first conductive layer 123' may be defined as a conductive layer adjacent to a protrusion part of the core pillar 143 among the conductive layers 123. Similarly, a first interlayer insulating layer 111' may be defined as an interlayer insulating layer adjacent to the protrusion part of the core pillar 143 among the interlayer insulating layers 111.

Figure 5F:
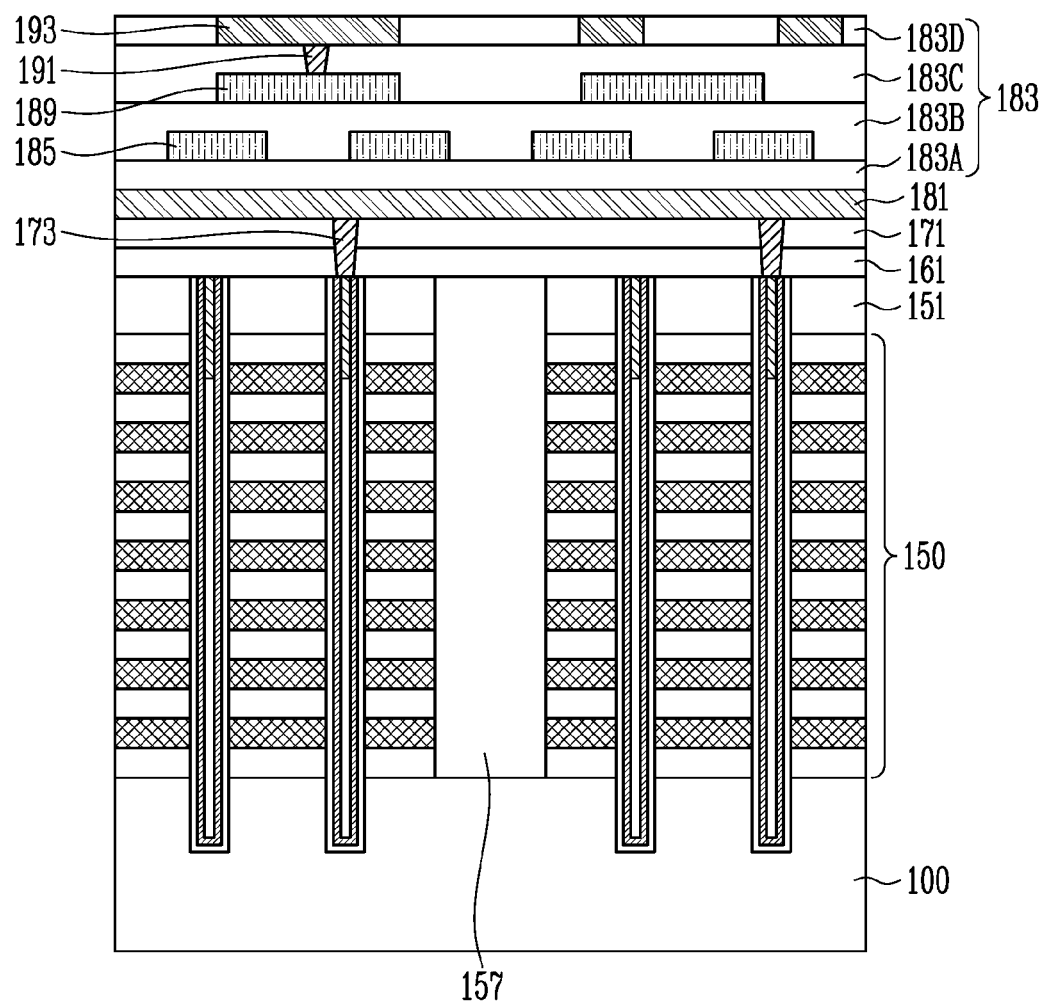

Referring to FIG. 5F, the slit 153 shown in FIG. 5E is filled with a vertical insulator 157. Subsequently, at least one insulating layer may be formed on the first insulating layer 151. In an embodiment, a second insulating layer 161 and a third insulating layer 171 may be stacked on the first insulating layer 151. Subsequently, contact plugs 173 may be formed, which penetrate the third insulating layer 171 and the second insulating layer 161. The contact plugs 173 may extend to be in contact with the channel structure 149.

Subsequently, a line array 181 may be formed. In an embodiment, the line array 181 may be a bit line connected to the contact plug 173. Subsequently, a first insulating structure 183 may be formed, which covers the line array 181.

The first insulating structure 183 may include two or more insulating layers, with four being shown 183A, 183B, 183C, and 183D. First connection structures may be buried inside the first insulating structure 183. Each of the first connection structures may include a plurality of conductive layers 185, 189, 191, and 193. The first insulating structures 183 and the first connection structures are not limited to the example shown in the drawing, and may be variously changed. The plurality of conductive layers 185, 189, 191, and 193 may include a first bonding metal 193.

Figure 6:
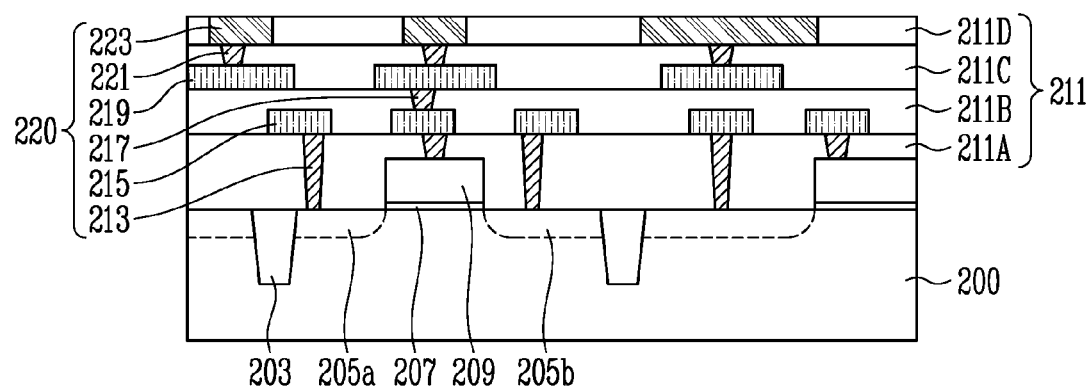

Referring to FIG. 6, the manufacturing method may include a process of forming a plurality of transistors constituting a peripheral circuit on a second substrate 200. The second substrate 200 may be formed of the same material as the substrate SUB described above with reference to FIG. 1.

Each of the transistors may be formed in an active region of the second substrate 200, which is partitioned by an isolation layer 203. Each of the transistors may include a gate insulating layer 207 and a gate electrode 209, which are stacked on an active region corresponding thereto, and junctions 205a and 205b formed in the active region at both sides of the gate electrode 209. The junctions 205a and 205b may include a conductivity type dopant for implementing a transistor corresponding thereto. The junctions 205a and 205b may include at least one of an n-type dopant and a p-type dopant.

The manufacturing method may include a process of forming second connection structures 220 connected to the transistors constituting the peripheral circuit and a second insulating structure 211 covering the second connection structures 220 and the transistors.

The second insulating structure 211 may include two or more insulating layers, with four being shown 211A, 211B, 211C, and 211D. The second connection structures 220 may be buried inside the second insulating structure 211. Each of the second connection structures 220 may include a plurality of conductive layers 213, 215, 217, 219, 221, and 223. The second insulating structure 211 and the second connection structures 220 are not limited to the example shown in the drawing, and may be variously changed. The plurality of conductive layers 213, 215, 217, 219, 221, and 223 may include a second bonding metal 223.

Figure 7:
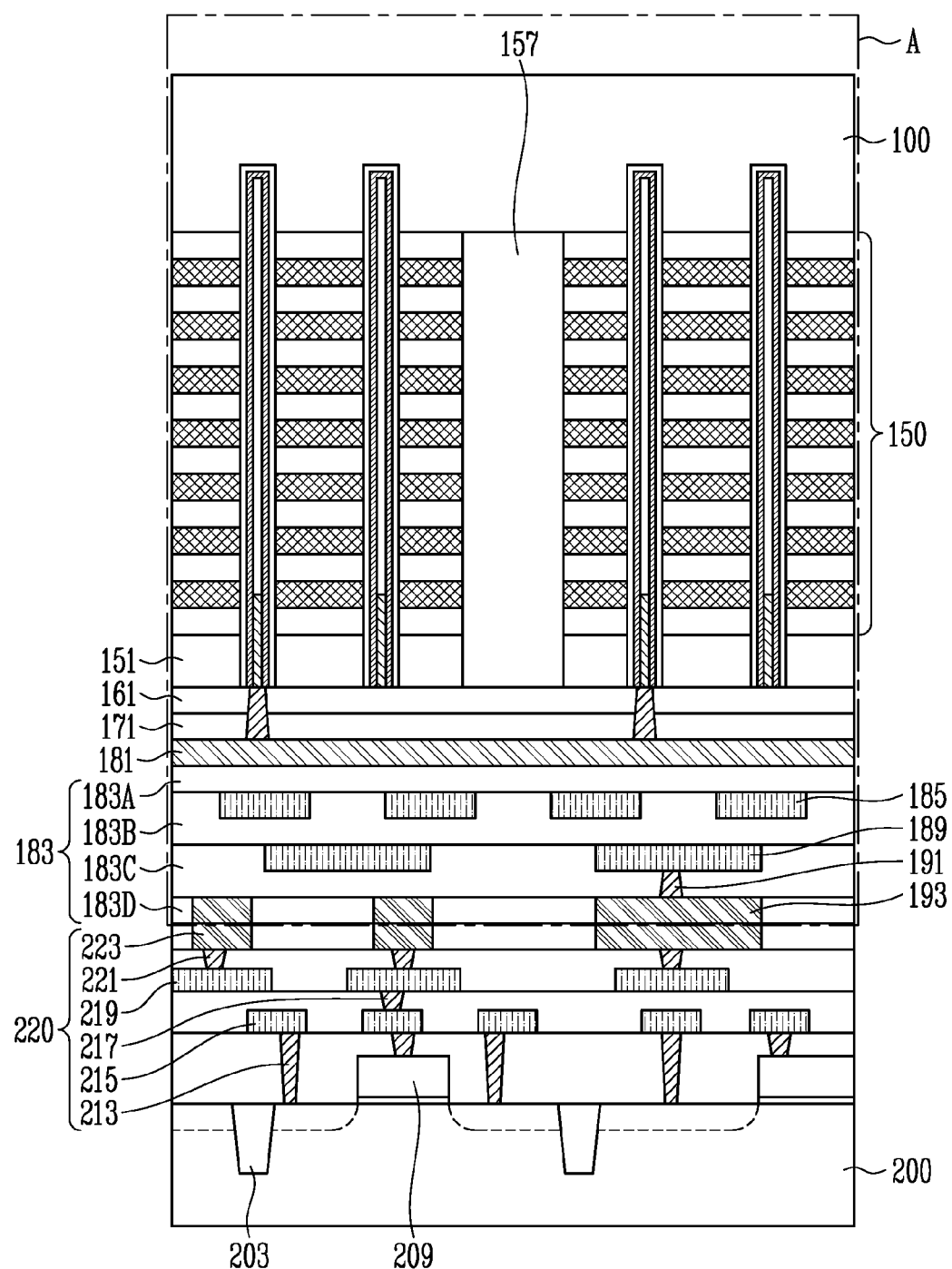

Referring to FIG. 7, the manufacturing method may include a process of aligning the first substrate 100 and the second substrate 200 such that the first bonding metal 193 on the first substrate 100 and the second bonding metal 223 on the second substrate 200 are in contact with each other. The first bonding metal 193 and the second bonding metal 223 may include various metals. For example, the first bonding metal 193 and the second bonding metal 223 may include copper.

After the first substrate 100 and the second substrate 200 are aligned, the first bonding metal 193 and the second bonding metal 223 may be adhered to each other. To this end, after heat is applied to the first bonding metal 193 and the second bonding metal 223, the first bonding metal 193 and the second bonding metal 223 may be cured. However, the present disclosure is not limited thereto, and various processes for connecting the first bonding metal 193 and the second bonding metal 223 to each other may be introduced.

FIGS. 8A to 8D are enlarged views of region A shown in FIG. 7, and illustrate a subsequent process.

Figure 8A:
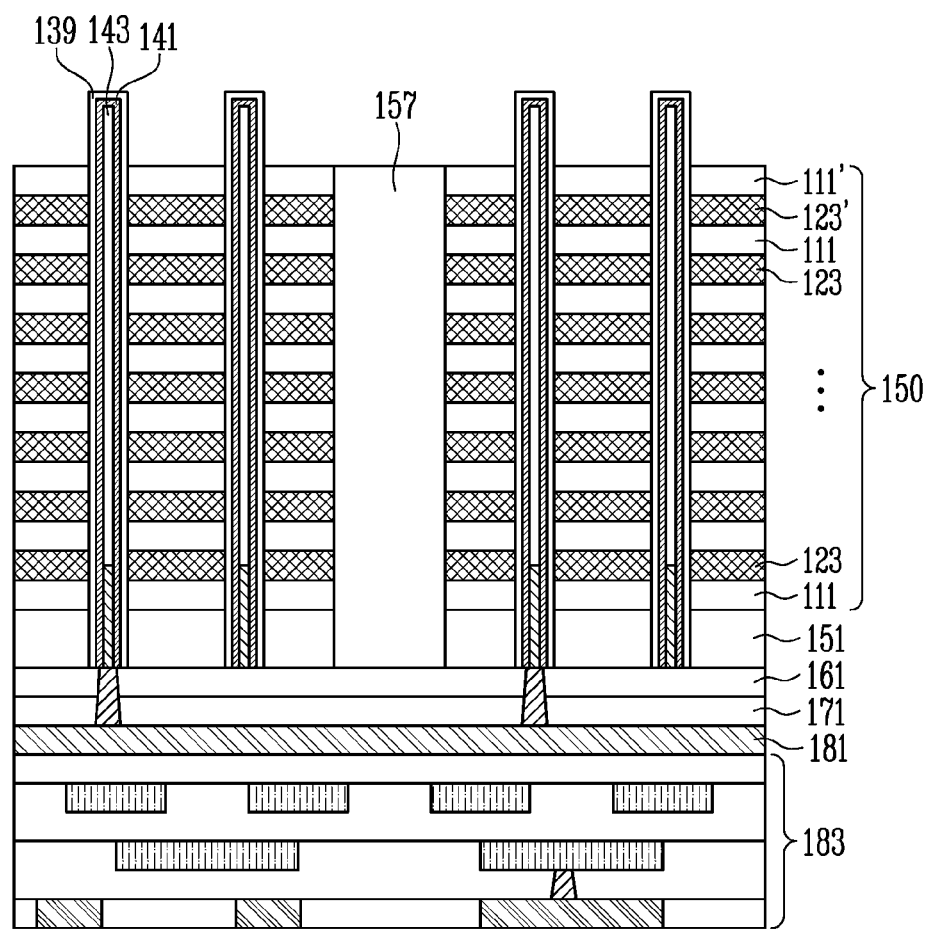

Referring to FIG. 8A, the manufacturing method may include a process of selectively removing the first substrate 100 shown in FIG. 7. When the first substrate 100 is removed, the memory layer 139 may serve as an etch stop layer. The channel layer 141 and the protrusion part of the core pillar 143 may remain in which the channel layer 141 and the protrusion part of the core pillar 143 protrude farther than the gate stack structure 150.

Figure 8B:
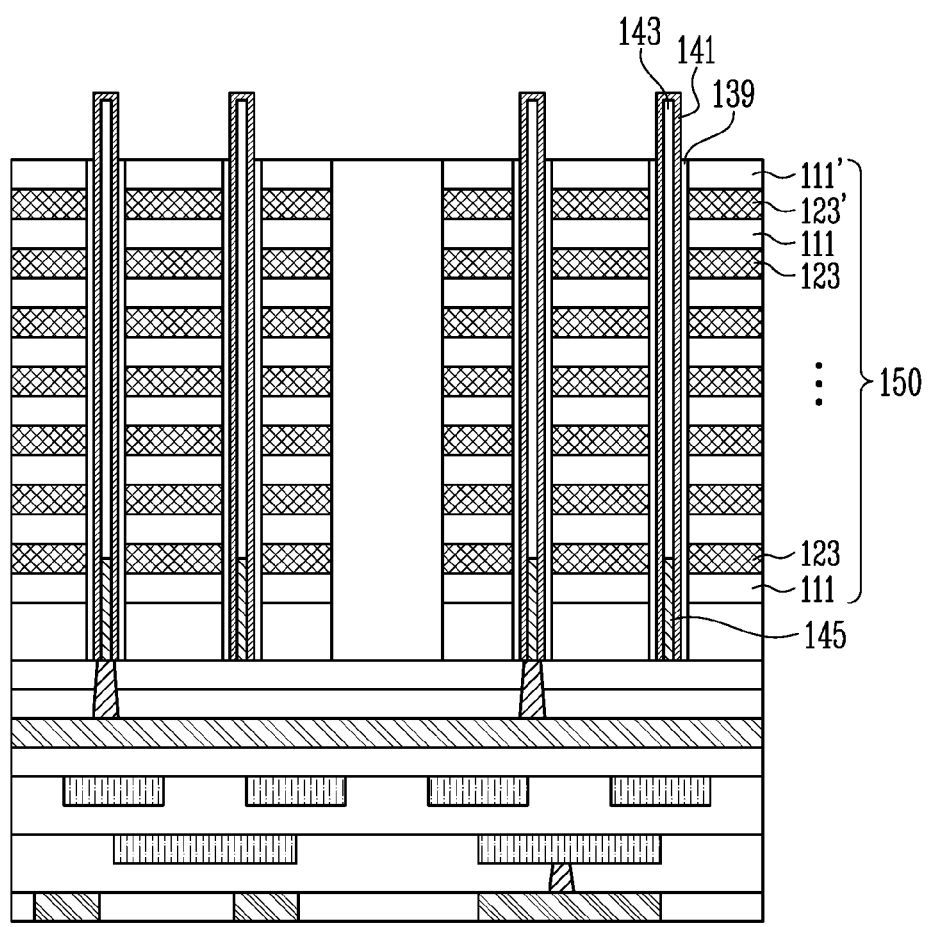

Referring to FIG. 8B, the manufacturing method may include a process of selectively removing a portion of the memory layer 139. When the memory layer 139 is removed, the channel layer 141 may serve as an etch stop layer. The first interlayer insulating layer 111' adjacent to the channel layer 141 and the protrusion part of the core pillar 143 among the interlayer insulating layers 111 may remain when the memory layer 139 having a thickness thinner than a thickness of the first interlayer insulating layer 111' is removed.

Subsequently, referring to FIG. 8C, a portion of the channel layer 141 shown in FIG. 8B may be selectively removed. Accordingly, a recess region 170 may be defined between the memory layer 139 and the core pillar 143. In addition, the protrusion part of the core pillar 143 may remain in a state in which the protrusion part of the core pillar 143 protrudes farther than the gate stack structure 150. A depth of the recess region 170 may be designed by considering a junction overlap region, and may be variously designed according to a design rule of the semiconductor memory device. In an embodiment, the recess region 170 may extend to a level of the first conductive layer 123'. The first conductive layer 123' may be defined as a conductive layer adjacent to the protrusion part of the core pillar 143 among the conductive layers 123. Similarly, the first interlayer insulating layer 111' may be defined as an insulating layer adjacent to the protrusion part of the core pillar 143 among the interlayer insulating layers 111.

Figure 8C:
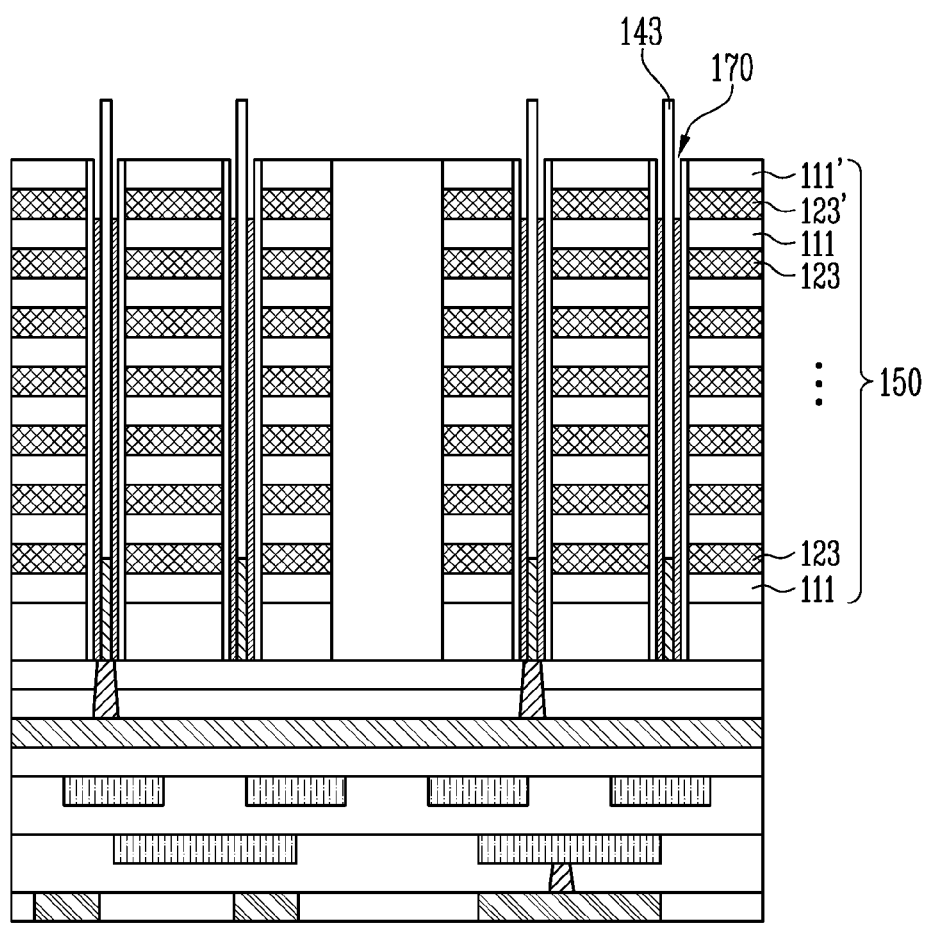
Figure 8D:
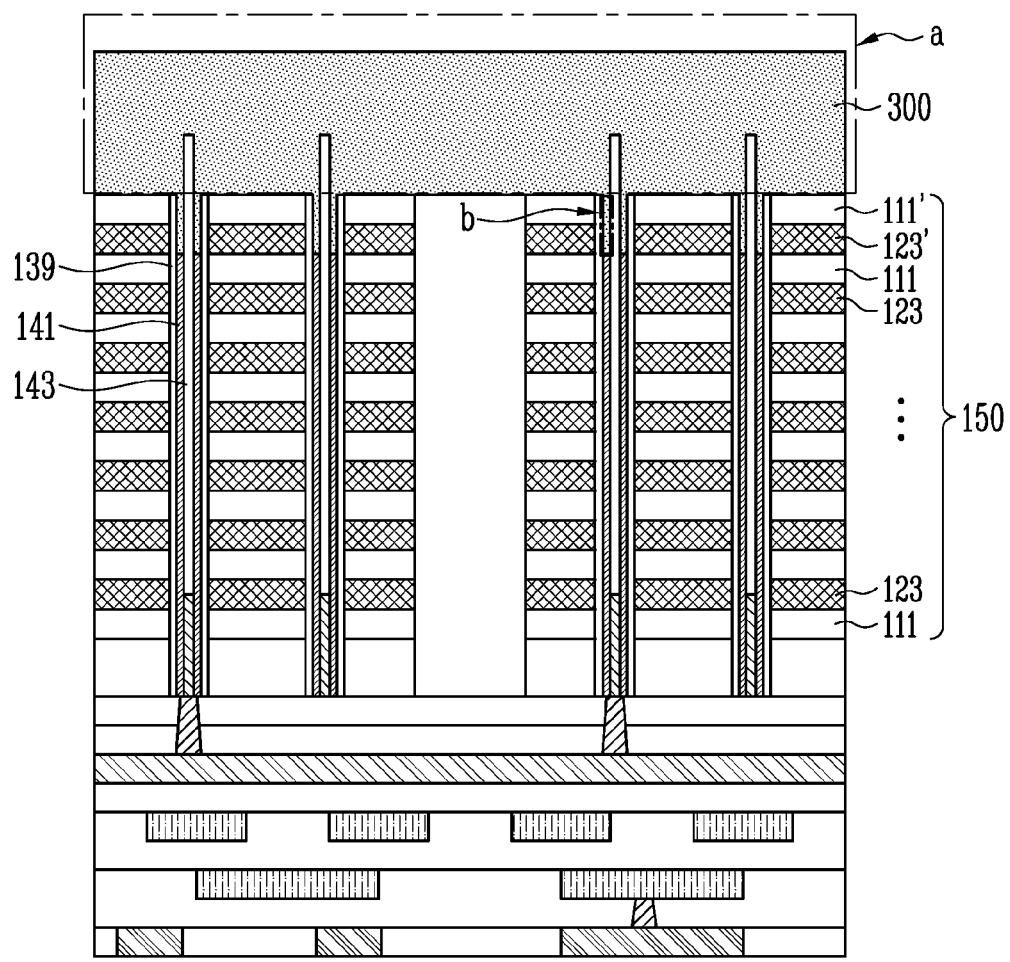

Referring to FIG. 8D, the recess region 170 shown in FIG. 8C may be filled with a doped semiconductor part 300. The core pillar 143 may protrude farther in the vertical direction than an interface between the doped semiconductor part 300 and the channel layer 141. The doped semiconductor part 300 may extend to be in contact with the gate stack structure 150. The doped semiconductor part 300 may be in contact with the protrusion part of the core pillar 143 and the channel layer 141. The doped semiconductor part 300 may be disposed to be spaced apart from the peripheral circuit with the gate stack structure 150 interposed therebetween.

In an embodiment, the doped semiconductor part 300 may include a first region a overlapping with the gate stack structure 150 and the protrusion part of the core pillar 143 and a second region b extending between the memory layer 139 and the core pillar 143. The second region may extend up to the level at which the first conductive layer 123' is disposed. The core pillar 143 may be disposed between the first region a of the doped semiconductor part 300 and the capping pattern.

In an embodiment, the second region b may be in contact with the channel layer 141, and the first region a may be in contact with the core pillar 143.

In an embodiment, the doped semiconductor part 300 may constitute a source layer used as a discharge path of charges during an erase operation of the semiconductor memory device.

In accordance with the embodiment of the present disclosure, the second region b of the doped semiconductor part 300 is disposed adjacent to the first conductive layer 123, so that the junction overlap region can be configured. The second region b of the doped semiconductor part 300, which is adjacent to the first conductive layer 123, can increase gate induced drain leakage (GIDL) occurrence efficiency in an erase operation of the semiconductor memory device using a GIDL scheme. The erase operation in accordance with the embodiment of the present disclosure may be performed using a well-erase scheme through hole injection from the doped semiconductor part 300. To this end, the doped semiconductor part 300 may include a p-type impurity such as boron.

In accordance with the embodiment of the present disclosure, although a thermal process for diffusing a dopant into the channel layer 141 from the doped semiconductor part 300 is omitted, a junction overlap region may be formed through the second region b of the doped semiconductor part 300. The junction overlap region may be defined according to the depth of the recess region 170 formed by quantitatively controlling an etching amount of the channel layer 141, using a difference in etching rate between the channel layer 141 and the memory layer 139. The method of controlling the etching amount is advantageous in uniformly controlling the depth of the junction overlap region, as compared with a thermal diffusion method. Thus, in accordance with an embodiment of the present disclosure, the stability of a process of forming the junction overlap region can be improved.

Further, in accordance with an embodiment of the present disclosure, although a thermal process for dopant diffusion at a low temperature is performed or although a laser anneal (ANL) process for dopant diffusion at a low temperature is performed, the depth at which the junction overlap region is formed can be stably secured by controlling a depth in which the channel layer 141 is etched.

Figure 9:
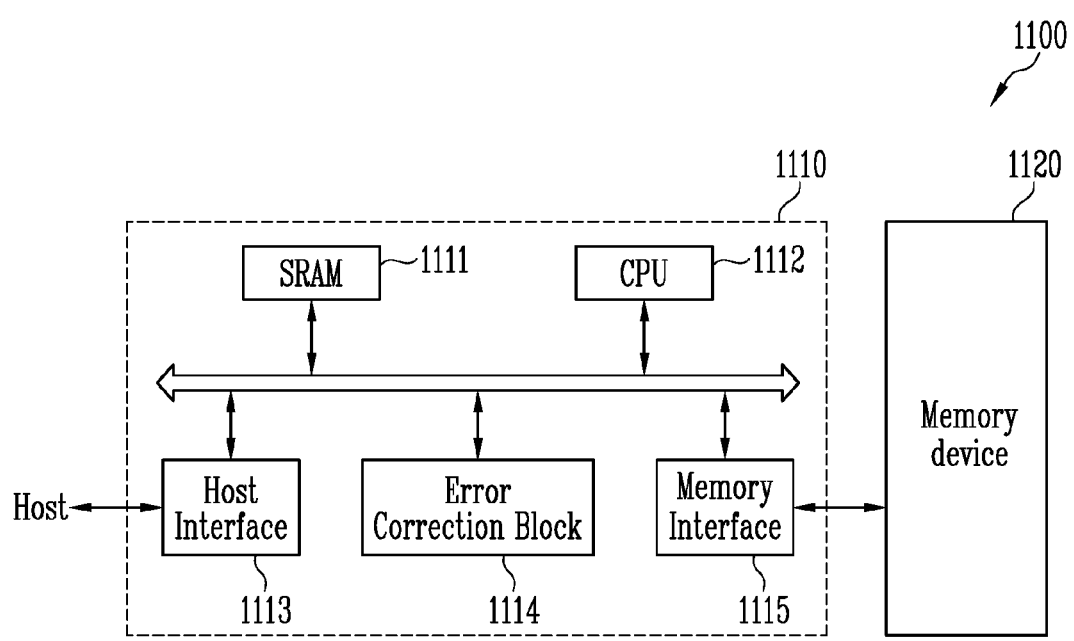
FIG. 9 is a block diagram illustrating a configuration of a memory system in accordance with an embodiment of the present disclosure.

FIG. 9 is a block diagram illustrating a configuration of a memory system 1100 in accordance with an embodiment of the present disclosure.

Referring to FIG. 9, the memory system 1100 includes a memory device 1120 and a memory controller 1110.

The memory device 1120 may be a multi-chip package configured with a plurality of flash memory chips. The memory controller 1110 controls the memory device 1120, and may include Static Random Access Memory (SRAM) 1111, a Central Processing Unit (CPU) 1112, a host interface 1113, an error correction block 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The error correction block 1114 detects an error included in data read from the memory device 1120, and corrects the detected error. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 10:
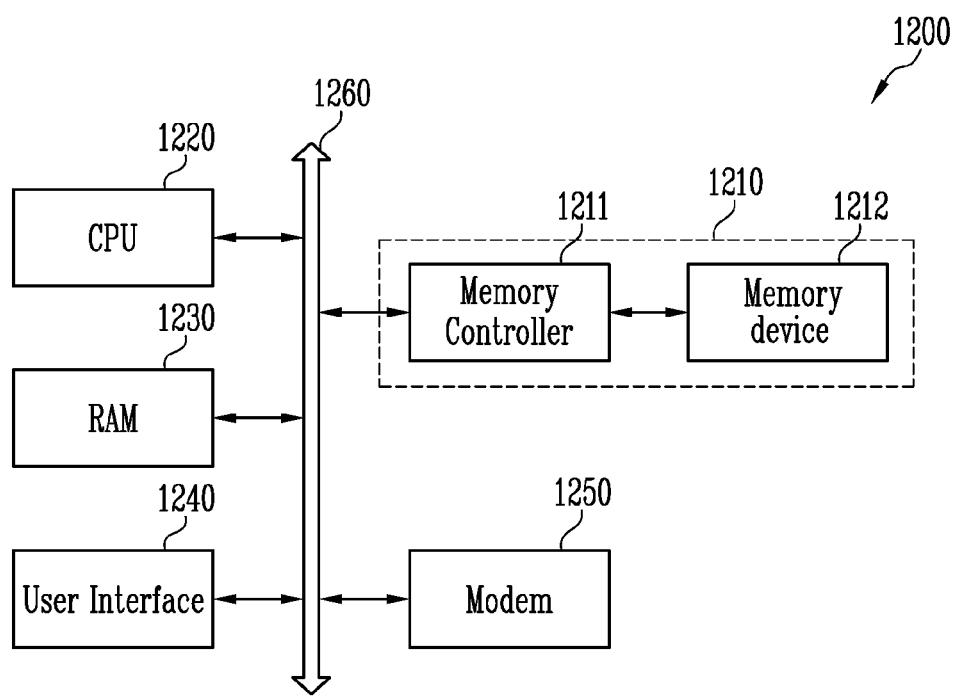
FIG. 10 is a block diagram illustrating a configuration of a computing system in accordance with an embodiment of the present disclosure.

FIG. 10 is a block diagram illustrating a configuration of a computing system 1200 in accordance with an embodiment of the present disclosure.

Referring to FIG. 10, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, mobile D-RAM, and the like may be further included.

The memory system 1210 may be configured with a memory device 1212 and a memory controller 1211.

In the present disclosure, a junction overlap region of a channel structure is configured, so that gate induced drain leakage (GIDL) occurrence efficiency in an erase operation of the semiconductor memory device using a GIDL scheme can be increased. Accordingly, the operation reliability and process stability of the semiconductor memory device can be improved.

While the present disclosure has been shown and described with reference to certain example embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the example embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:
a gate stack structure including interlayer insulating layers and conductive layers, which are alternately stacked;
a core pillar penetrating the gate stack structure;
a channel layer disposed between the core pillar and the gate stack structure;
a memory layer disposed between the channel layer and the gate stack structure; and
a doped semiconductor part in contact with the gate stack structure, wherein the doped semiconductor part includes:
a first region surrounding the core pillar up to an interface in contact with the gate stack structure; and
a second region extending between the memory layer and the core pillar from the first region,
wherein at least a portion of the second region of the doped semiconductor part is surrounded by at least one of the conductive layers.

2. The semiconductor memory device of claim 1, wherein the core pillar includes a protrusion part protruding farther than the gate stack structure in a direction toward the doped semiconductor part, and
wherein the first region surrounds the protrusion part of the core pillar.

3. The semiconductor memory device of claim 2, wherein the second region extends up to an interface at which a first conductive layer of the conductive layers adjacent to the protrusion part of the core pillar is disposed.

4. The semiconductor memory device of claim 1, wherein the second region is in contact with the channel layer.

5. The semiconductor memory device of claim 1, further comprising a capping pattern surrounded by the memory layer,
wherein the core pillar is disposed between the first region of the doped semiconductor part and the capping pattern.

6. A semiconductor memory device comprising:
a substrate including a peripheral circuit;
a memory cell array including a gate stack structure disposed above the peripheral circuit, a core pillar penetrating the gate stack structure, a channel layer disposed between the core pillar and the gate stack structure, and a memory layer disposed between the channel layer and the gate stack structure; and
a doped semiconductor part including a first region surrounding the core pillar up to an interface in contact with the gate stack structure, and a second region extending between the core pillar and the memory layer from the first region,
wherein at least a portion of the second region of the doped semiconductor part is surrounded by at least one of conductive layers included in the gate stack structure.

7. The semiconductor memory device of claim 6, wherein the core pillar has a protrusion part protruding farther than the gate stack structure in a direction toward the doped semiconductor part.

8. The semiconductor memory device of claim 7, wherein the doped semiconductor part is in contact with the protrusion part of the core pillar and the channel layer.

9. The semiconductor memory device of claim 7, wherein the doped semiconductor part extends up to an interface at which a first conductive layer adjacent to the protrusion part of the core pillar is disposed.

10. The semiconductor memory device of claim 6, wherein the doped semiconductor part constitutes a source layer.

11. The semiconductor memory device of claim 6, wherein the core pillar protrudes farther than an interface between the doped semiconductor part and the channel layer in a direction extending from the gate stack structure into the first region of the doped semiconductor part.

12. The semiconductor memory device of claim 6, wherein the gate stack structure is interposed between the doped semiconductor part and the peripheral circuit.

13. The semiconductor memory device of claim 6, further comprising a line array disposed between the gate stack structure and the peripheral circuit.

14. The semiconductor memory device of claim 13, wherein the line array includes a bit line connected to the channel layer.

15. The semiconductor memory device of claim 13, further comprising:
   a first bonding metal disposed between the line array and the peripheral circuit; and
   a second bonding metal disposed between the peripheral circuit and the first bonding metal, the second bonding metal being bonded to the first bonding metal.

* * * * *